United States Patent
Shu et al.

(10) Patent No.: US 10,002,793 B1
(45) Date of Patent: Jun. 19, 2018

(54) SUB-FIN DOPING METHOD

(71) Applicant: GLOBALFOUNDRIES INC., Grand Cayman (KY)

(72) Inventors: Jiehui Shu, Ballston Lake, NY (US); David P. Brunco, Latham, NY (US); Jinping Liu, Clifton Park, NY (US); Baofu Zhu, Clifton Park, NY (US); Shesh Mani Pandey, Saratoga Spring, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/464,591

(22) Filed: Mar. 21, 2017

(51) Int. Cl.
*H01L 21/76* (2006.01)
*H01L 21/8234* (2006.01)
*H01L 21/761* (2006.01)
*H01L 21/225* (2006.01)

(52) U.S. Cl.
CPC .. *H01L 21/823481* (2013.01); *H01L 21/2254* (2013.01); *H01L 21/761* (2013.01); *H01L 21/823412* (2013.01); *H01L 21/823431* (2013.01)

(58) Field of Classification Search
CPC ............... H01L 21/823481; H01L 21/2254
USPC ......................................................... 438/415
See application file for complete search history.

(56) References Cited

U.S. PATENT DOCUMENTS

| 8,114,761 | B2 | 2/2012 | Mandrekar et al. |
| 9,530,698 | B1* | 12/2016 | Basker ............ H01L 21/823821 |
| 2016/0056156 | A1 | 2/2016 | Ghani et al. |
| 2016/0322356 | A1* | 11/2016 | Liu .................... H01L 21/26506 |
| 2016/0343623 | A1* | 11/2016 | Fogel .............. H01L 21/823878 |

FOREIGN PATENT DOCUMENTS

| WO | 2015047253 A1 | 4/2015 |
| WO | 2015199705 A1 | 12/2015 |

* cited by examiner

*Primary Examiner* — Anthony Ho
(74) *Attorney, Agent, or Firm* — Scully Scott Murphy and Presser; Frank DiGiglio

(57) ABSTRACT

A gap fill method for sub-fin doping includes forming semiconductor fin arrays over a semiconductor substrate, forming a first dopant source layer over a first fin array and filling intra fin gaps within the first array, and forming a second dopant source layer over a second fin array and filling intra fin gaps within the second array. The first and second dopant source layers are recessed to expose a channel region of the fins. Thereafter, an annealing step is used to drive dopants from the dopant source layers locally into sub-fin regions of the fins below the channel regions.

16 Claims, 16 Drawing Sheets

SUB-FIN DOPING METHOD

BACKGROUND

The present application relates generally to semiconductor devices, and more specifically to fin field effect transistors and their methods of production.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. The fins are etched to a depth to provide a desired height for an active channel region and to include adequate sub-fin isolation for a particular device. A gate structure is deposited over the channel region to contact multiple surfaces of each fin to form a multi-gate architecture.

As device dimensions scale, including the dimensions between adjacent devices or features, associated processing has become increasingly complex. Isolation doping of the sub-fin region, for example, is difficult to perform without affecting doping of the active channel region, and hence the carrier mobility therein. Furthermore, as the intra fin spacing decreases, the localized introduction of dopants into the fins, and the integration of conformal masking layers that are typically used to form devices having complementary polarities, has become increasingly challenging.

SUMMARY

In view of the foregoing, it would be beneficial to develop a method to enable sub-fin doping at advanced nodes that is compatible with complementary device architectures and the challenges posed by the attendant geometries. Disclosed is a gap fill approach for sub-fin doping. The gap fill method eliminates the need for intra fin barrier or masking layers, and thus obviates many of the geometric challenges associated with a small fin-pitch layout.

In accordance with embodiments of the present application, a method of fabricating a semiconductor structure involves forming a plurality of semiconductor fins over a semiconductor substrate, where the semiconductor fins include a first fin array disposed over a first device region of the substrate and a second fin array disposed over a second device region of the substrate. A first dopant source layer is then formed over the first fin array, and a second dopant source layer is formed over the second fin array, wherein the first dopant source layer entirely fills intra fin gaps within the first fin array and the second dopant source layer entirely fills intra fin gaps within the second fin array.

In further embodiments, the method also includes recessing the first and second dopant source layers to expose a channel region of the fins, and driving dopants from the dopant source layers into sub-fin regions of the fins below the channel regions.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
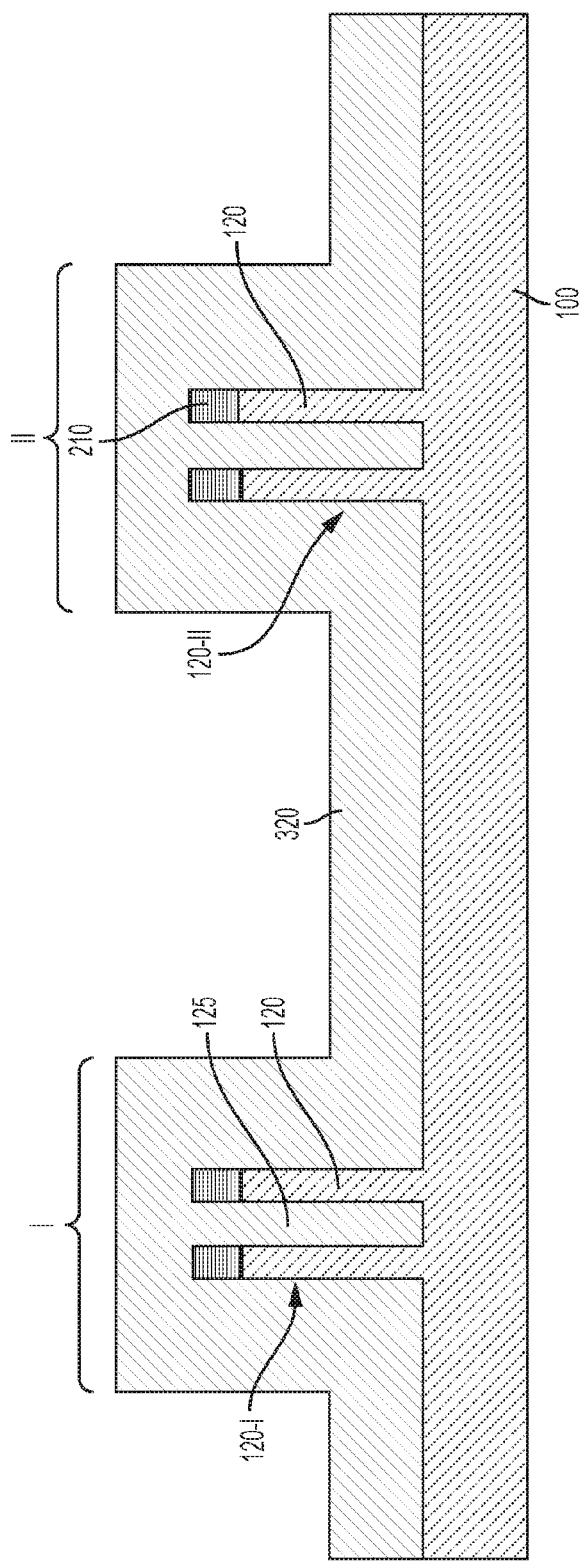
FIG. 1 is a schematic cross-sectional diagram of a FinFET device at an intermediate stage of fabrication, including a conformal first dopant source layer formed over a plurality of semiconductor fins within first and second device regions of a semiconductor substrate.

Reference will now be made in greater detail to various embodiments of the subject matter of the present application, some embodiments of which are illustrated in the accompanying drawings. The same reference numerals will be used throughout the drawings to refer to the same or similar parts.

Disclosed are methods for forming FinFET devices having highly-doped sub-fin regions, which provide device isolation and enable the formation of disparate or complementary device architectures across a single substrate or chip. In certain embodiments, sub-fin doping can be effective to decrease leakage through the sub-fin regions of the fins, while avoiding unintentional doping of the channel regions thereof.

Exemplary methods include forming a first array of semiconductor fins on a semiconductor substrate within a first device region of the substrate, and forming a second array of semiconductor fins on the substrate within a second device of the substrate. The sub-fin regions of the first array of fins can be doped with a dopant of a first conductivity type, and the sub-fin regions of the second array of fins can be doped with a dopant of a second conductivity type. Doping can be affected by solid state diffusion from one or more dopant source layers disposed directly over a portion of the fins.

In accordance with embodiments of the present application, a method of fabricating a semiconductor structure includes forming a first fin array over a first device region of a semiconductor substrate, and forming a second fin array over a second device region of the substrate. A first dopant source layer is formed over the first fin array such that the first dopant source layer entirely fills intra fin gaps within the first fin array, and a second dopant source layer is formed over the second fin array such that the second dopant source layer entirely fills intra fin gaps within the second fin array. The first and second dopant source layers are then recessed to expose a channel region of the fins, and a drive-in anneal is used to diffuse dopants from the dopant source layers into sub-fin regions of the fins.

Various embodiments related to the formation of such FinFET structures are described herein with reference to FIGS. 1-16. A patterning and sub-fin doping method according to one embodiment is shown in FIGS. 1-11. Relative to the embodiment of FIGS. 1-11, a tone inversion method according to a further embodiment is shown in FIGS. 12-16.

Referring to the intermediate structure depicted in the cross-sectional view of FIG. 1, a plurality of semiconductor fins 120 are arrayed over first and second device regions (1, II) of a semiconductor substrate 100. Fins 120 include a first array 120-I within first device region (I) and a second array 120-II within second device region (II). Although for the sake of clarity only two fins are shown in each array, it will be appreciated that any suitable number of fins may be used.

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, fins 120 comprise a semiconductor material such as silicon, and may be formed by patterning and then etching the semiconductor substrate 100, i.e., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In embodiments, the fins 120 can have a width of 5 nm to 20 nm, a height of 40 nm to 150 nm, and a pitch of 20 nm to 100 nm, although other dimensions are also contemplated. Fins 120 may be arrayed on the substrate at a regular or irregular intra fin spacing or pitch (d). As used herein, the term "pitch" refers to the distance between one structure or feature (e.g., a first fin) and an adjacent structure or feature (e.g., a second fin). In example embodiments, the fin pitch (d) may be within a range of 20 to 100 nm, e.g., 20, 30, 40, 50, 60, 70, 80, 90 or 100 nm, including ranges between any of the foregoing values, although smaller and larger pitch values may be used. In various embodiments, the fin pitch within the first fin array may be constant or variable, and independent of the fin pitch within the second fin array, which may be constant or variable.

As will be appreciated by those skilled in the art, incident to the formation of the fins, each fin 120 may be capped with a capping layer 210 that may protect the underlying fin from damage during processing and may remain on the fins throughout several processing steps. As formed, the fins 120 may include a nitride capping layer 210 and may be undoped or lightly doped. By way of example, a dopant concentration within the as-formed fins may be less than $1 \times 10^{18}$ atoms/cm$^3$.

Referring still to FIG. 1, a first dopant source layer 320 is deposited over the fin arrays in each of the first and second device regions. In various embodiments, formation of the first dopant source layer 320 includes a conformal deposition process such as a chemical vapor deposition (CVD) process or an atomic layer deposition (ALD) process. The first dopant source layer 320 is deposited directly over the sidewalls of the fins and over the semiconductor substrate between the fin arrays as well as within the intra fin gaps 125.

In certain embodiments, the thickness of the first dopant source layer 320 is sufficient to pinch off and completely fill the intra fin gaps 125 and entirely envelop the fins. The thickness of the first dopant source layer 320 may range from 10 to 50 nm, for example, e.g., 10, 15, 20, 25 or 50 nm, including ranges between any of the foregoing values. The intra fin gaps 125 extend between opposing sidewalls of adjacent fins 120 within a fin array.

The first dopant source layer may include a p-type dopant or an n-type dopant. As known to those skilled in the art, doping changes the electron and hole carrier concentrations of an intrinsic semiconductor at thermal equilibrium. As used herein, "p-type" refers to the addition of impurities to an intrinsic semiconductor that creates a deficiency of valence electrons. For silicon, example p-type dopants, i.e., impurities, include but are not limited to, boron, aluminum, gallium, and indium. As used herein, "n-type" refers to the addition of impurities that contribute free electrons to an intrinsic semiconductor. For silicon, example n-type dopants, i.e., impurities, include but are not limited to, antimony, arsenic, and phosphorus.

In various embodiments, the first dopant source layer 320 may include a doped oxide such as a doped silicate glass. Borosilicate glass (BSG), for example, is a type of glass comprising silica and boron trioxide as the main glass-forming constituents. An alternative material for the first dopant source layer 320 is a phosphosilicate glass (PSG). Exemplary glass compositions may include 0.01 to 15 wt. % of a dopant. A boron-doped oxide may be used as the dopant source layer to form an NMOS sub-fin region, for example. A phosphorus-doped oxide may be used as the dopant source layer to form n PMOS sub-fin region.

Figure 2:
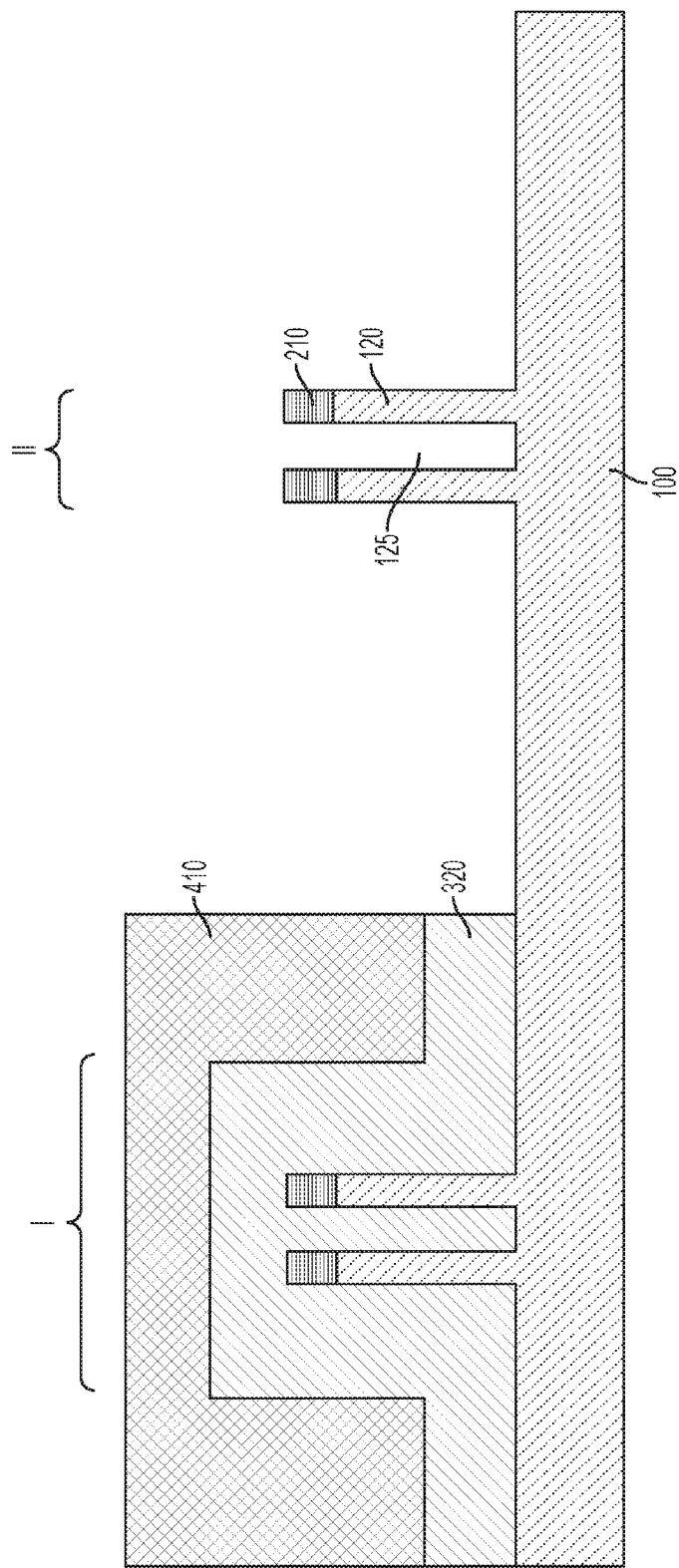
FIG. 2 shows patterning of a hard mask layer and the removal of the first dopant source layer from the second device region.

Referring to FIG. 2, shown is the formation and patterning of a hard mask 410 and the removal of the first dopant source layer 320 from the second device region (II) using the patterned hard mask 410 as an etch mask. Hard mask 410 may be a spin-on or spray-on hard mask, and may contain silicon dioxide or amorphous silicon, for example. The selective removal of the first dopant source layer 320 from the second device region (II) exposes the second array of fins.

The patterning process may comprise photolithography, which includes forming a layer of photoresist material (not shown) atop a material layer to be patterned. The photoresist may include a positive-tone photoresist composition, a negative-tone photoresist composition, or a hybrid-tone photoresist composition. A layer of photoresist may be formed by a deposition process such as, for example, spin-on coating.

The deposited photoresist is then subjected to a pattern of irradiation, and the exposed photoresist is developed utilizing a conventional resist developer. The pattern provided by the patterned photoresist is thereafter transferred into the underlying hardmask layer 410 utilizing at least one pattern transfer etching process.

The pattern transfer etching process may be an isotropic or an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

Figure 3:
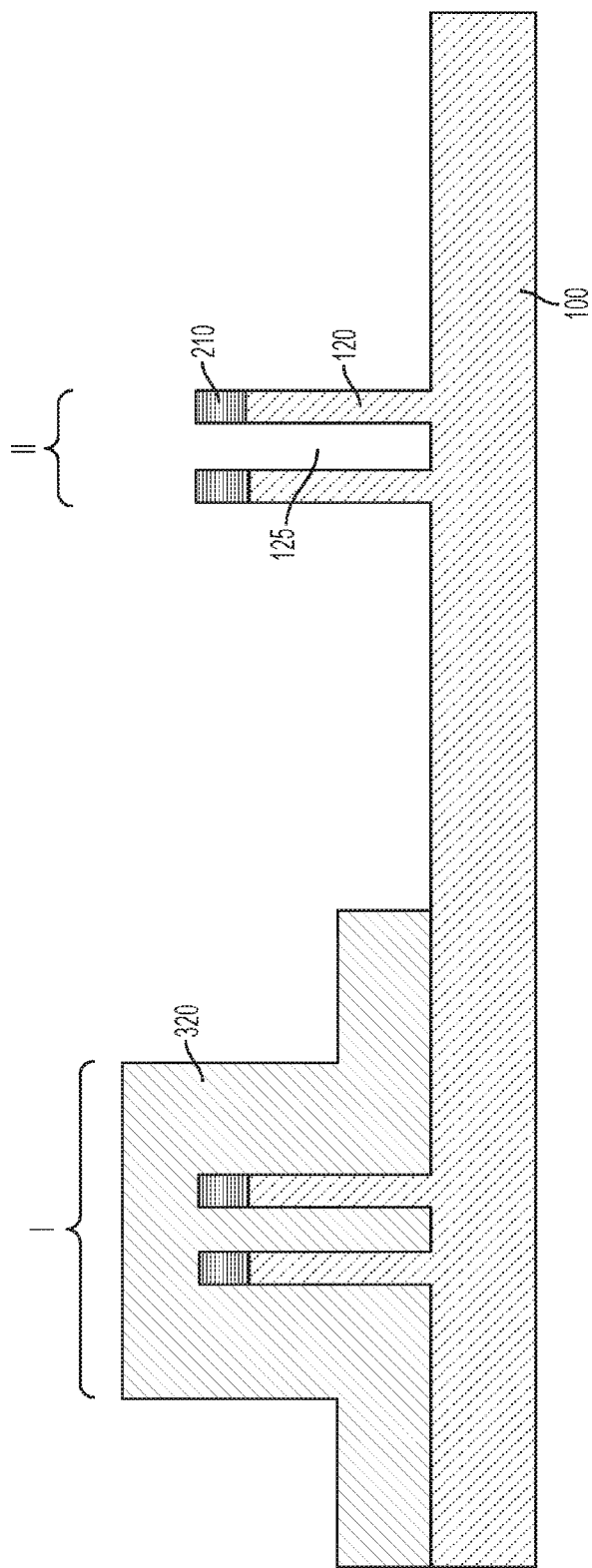
FIG. 3 shows stripping of the hard mask layer from over the patterned first dopant source layer within the first device region.
Figure 4:
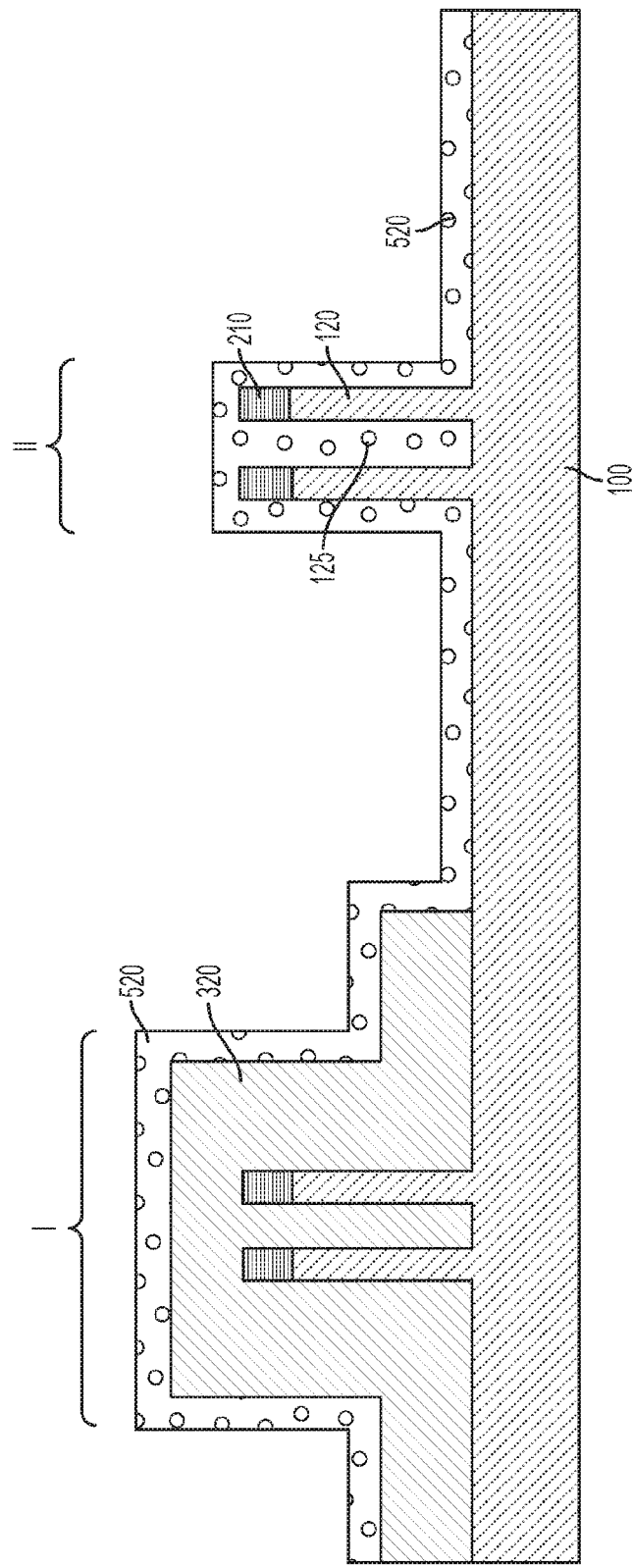
FIG. 4 illustrates the deposition of a second conformal dopant source layer over the first and second device regions.

Referring to FIG. 3, a conventional etching process may be used to strip the hard mask layer 410 from over the patterned first dopant source layer 320 within the first device region (I). Then, referring to FIG. 4, a second conformal dopant source layer 520 is formed over the first and second device regions. In particular, within the first device region (I), the second conformal dopant source layer 520 may be formed directly over the first dopant source layer 320, while in the second device region (II), the second conformal dopant source layer 520 may be formed directly over the sidewalls of the fins 120 and over the semiconductor substrate within the intra fin regions. As will be appreciated, the hard mask 410 and the accompanying masking operation will enable the incorporation of different dopant types into the sub-fins in each of the first and second device regions.

By way of example, the second dopant source layer 520 may include a doped oxide such as a doped silicate glass. In various embodiments, the second dopant source layer 520 includes a dopant having a dopant type opposite to the dopant type present within the first dopant source layer 320. For instance, the second dopant source layer 520 can include a p-type dopant and the first dopant source layer 320 can include an n-type dopant, or vice versa.

In certain embodiments, the thickness of the second dopant source layer 520 is sufficient to pinch off and completely fill the intra fin regions 125 and entirely envelop the fins 120 within the second device region (II). The thickness of the second dopant source layer 320 may range from 10 to 25 nm, for example, e.g., 10, 15, 20 or 25 nm, including ranges between any of the foregoing values.

Figure 5:
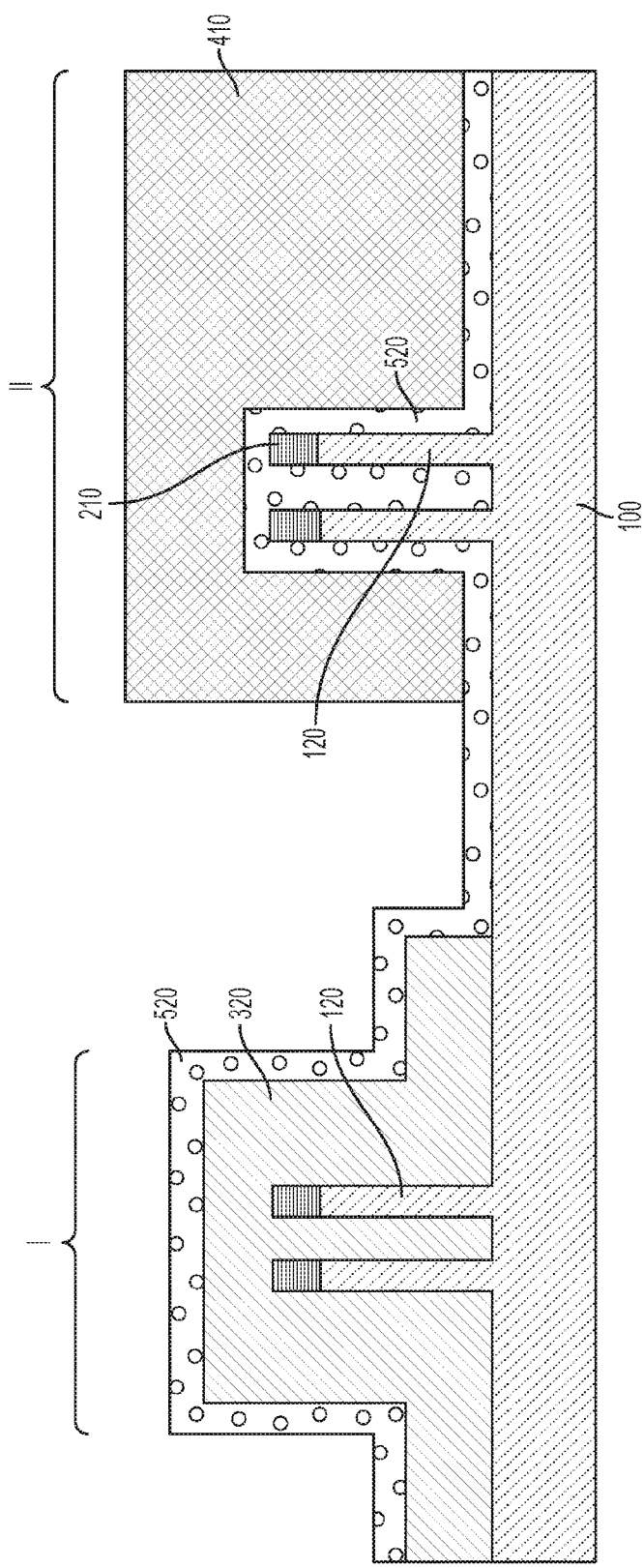
FIG. 5 shows patterning of a hard mask layer within the second device region.
Figure 6:
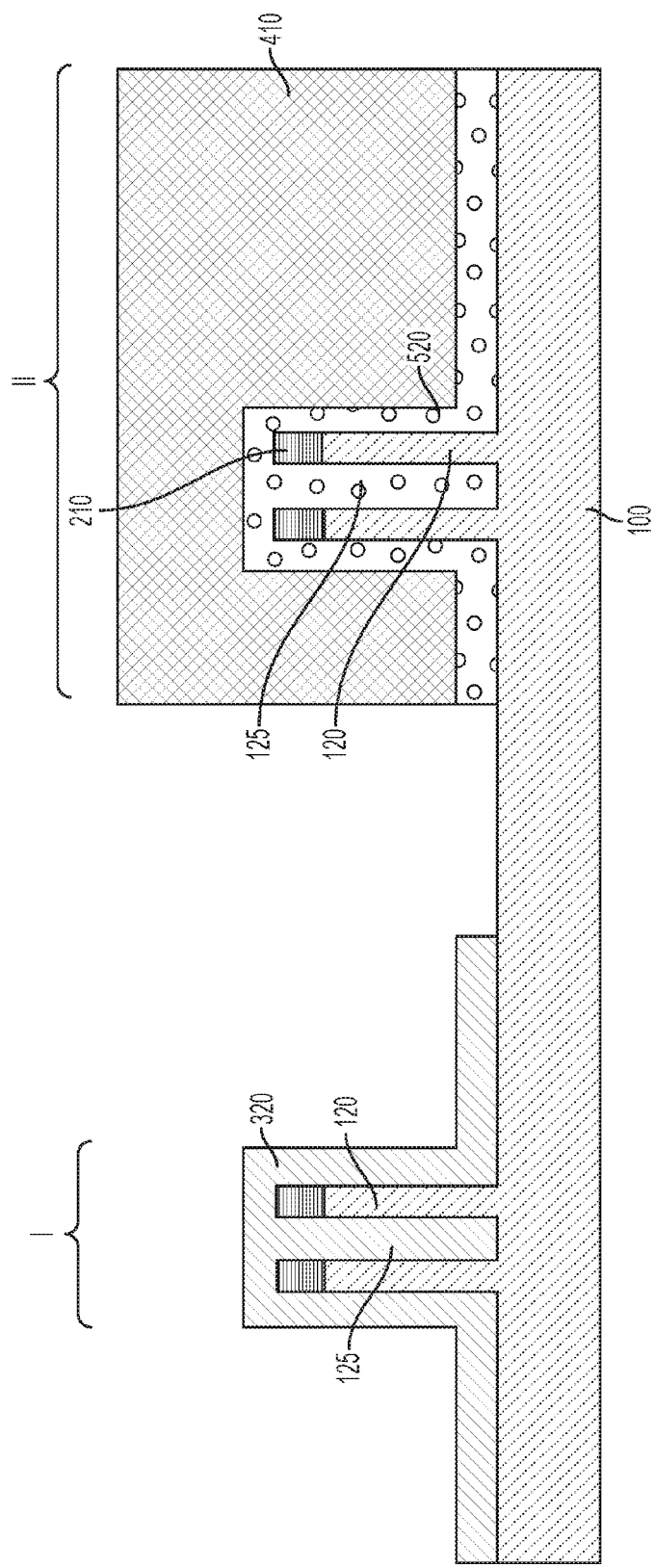
FIG. 6 depicts removal of the second dopant source layer from the first device region using the hard mask layer as an etch mask.

Referring to FIG. 5, using conventional lithographic techniques, a hard mask 410 such as a spin-on hard mask is deposited and patterned to overlie the second array of fins 120 within the second device region (II). Then, using the hard mask 410 as an etch mask, an isotropic etch such as a wet etch is used to remove the second dopant source layer 520 from over the first dopant source layer 320 within the first device region (I). In embodiments, the second dopant source layer 520 is entirely removed from within the first device region. In the illustrated embodiment, a portion of the first dopant source layer 320 may also be removed from over the first array of fin. FIG. 6 depicts removal of the second dopant source layer from the first device region using the hard mask layer as an etch mask.

In order to accommodate some etching of the first dopant source layer 320 within the first device region (I), the as-deposited thickness of the first dopant source layer 320 may be greater than the as-deposited thickness of the second dopant source layer 520. Following the etch back of the dopant source layer(s), and following removal of the hard mask layer 410 from over the second array of fins 120 as shown in FIG. 7, the first dopant source layer 320 completely fills the intra fin regions 125 within the first device region (I), and the second dopant source layer 520 completely fills the intra fin regions 125 within the second device region (II).

Figure 7:
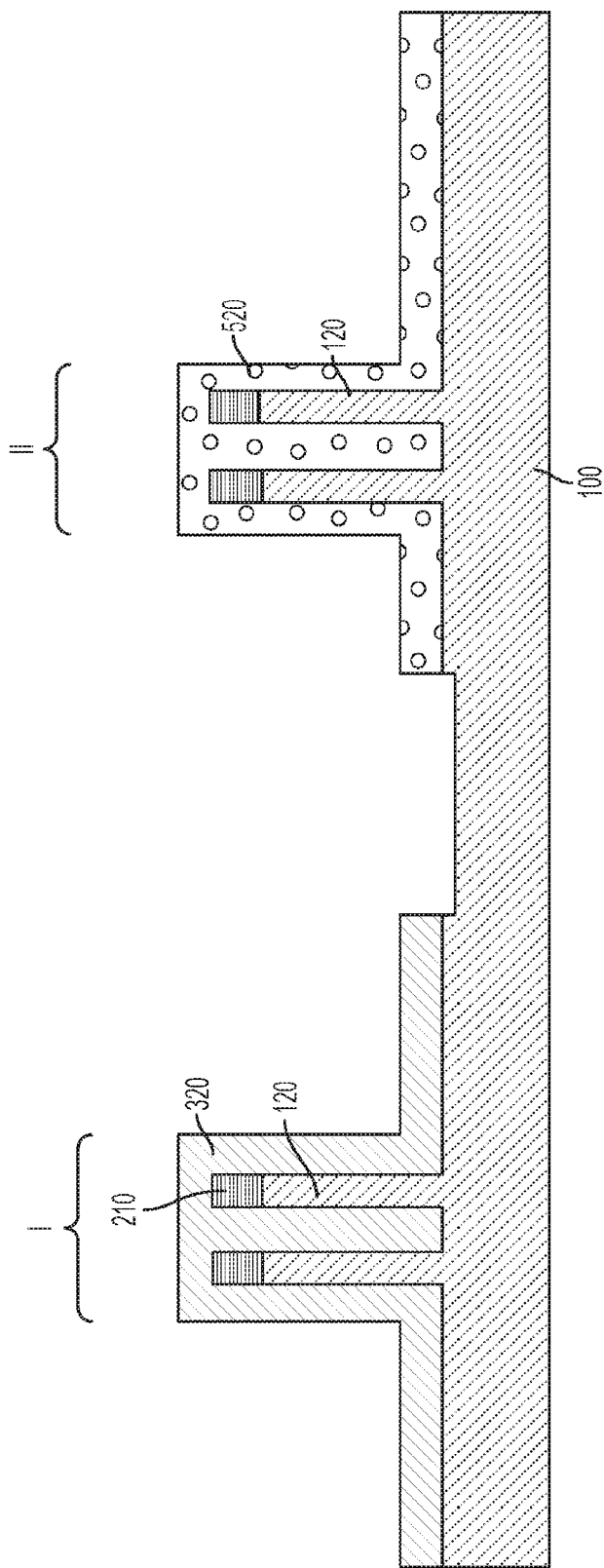
FIG. 7 shows stripping of the hard mask layer from over the patterned second dopant source layer within the second device region.
Figure 8:
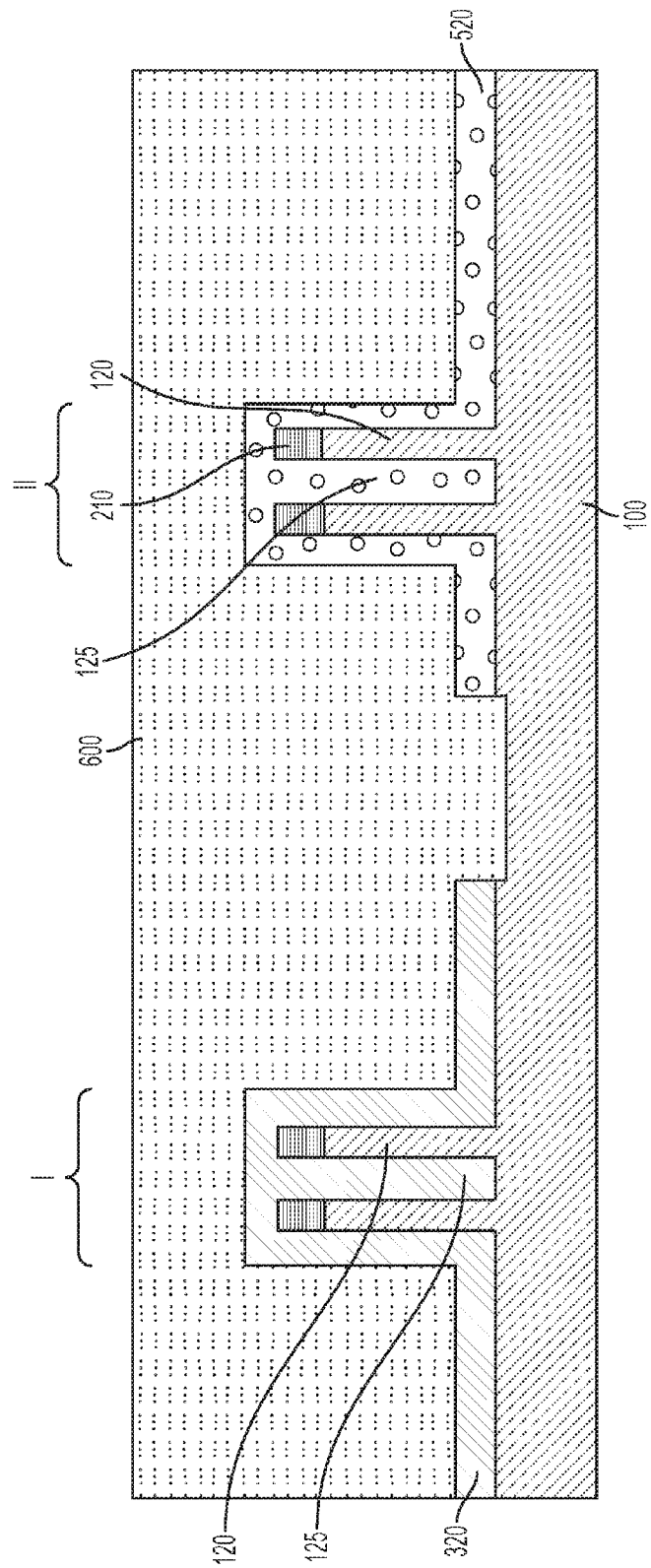
FIG. 8 illustrates deposition of a dielectric capping layer over the first and second patterned dopant source layers.

Referring to FIG. 8, a dielectric capping layer 600 is formed over the structure of FIG. 7, so as to completely cover the fin arrays 120-I, 120-II as well as the first and second dopant source layers 320, 520. Dielectric capping layer 600 may comprise silicon dioxide, for example. In various embodiments, a high density plasma chemical vapor deposition (HDP-CVD) process may be used to form the capping layer 600.

Figure 9:
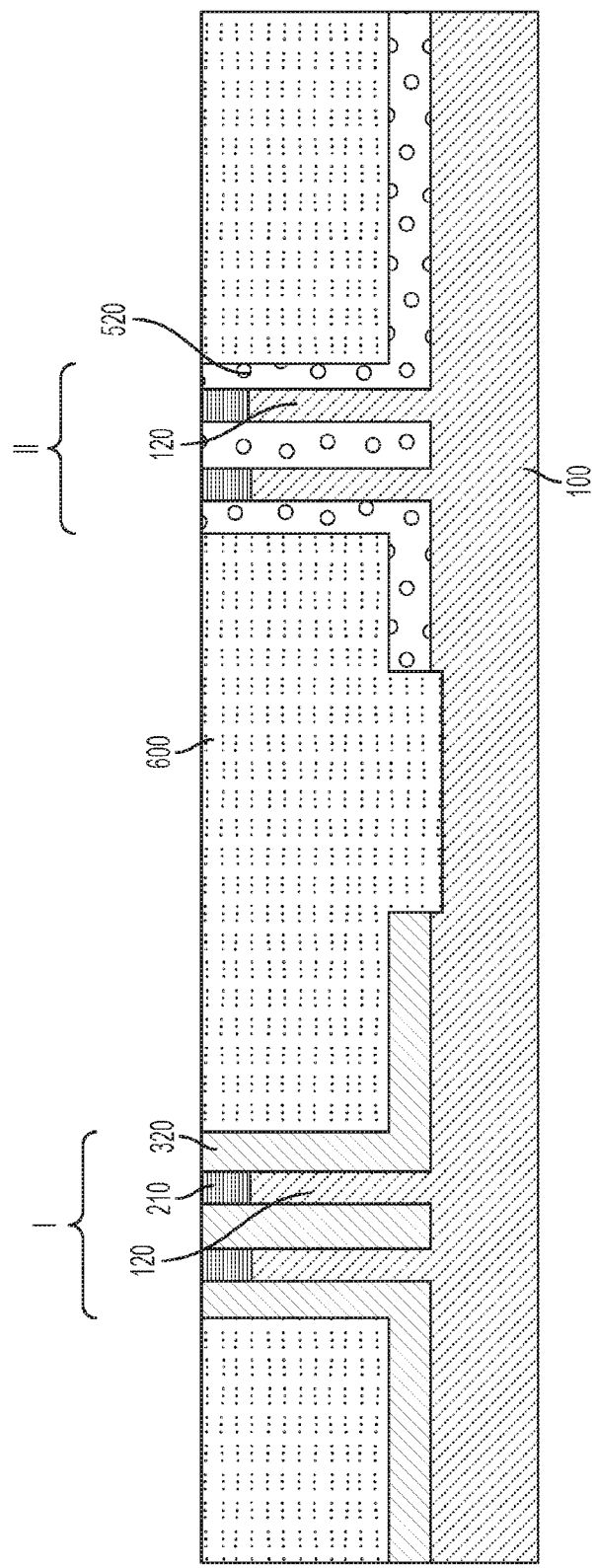
FIG. 9 shows polishing and planarization of the dielectric capping layer.

Referring to FIG. 9, after deposition of the dielectric capping layer 600, a planarizing process such as chemical mechanical polishing (CMP) may be used to expose the first and second dopant source layers 320 and the nitride caps 210. "Planarization" refers to a material removal process that employs at least mechanical forces, such as frictional media, to produce a substantially two-dimensional surface. Chemical mechanical polishing (CMP) is a material removal process that uses both chemical reactions and mechanical forces to remove material and planarize a surface. During the CMP step, nitride caps 210 may serve as a CMP etch stop.

Figure 10:
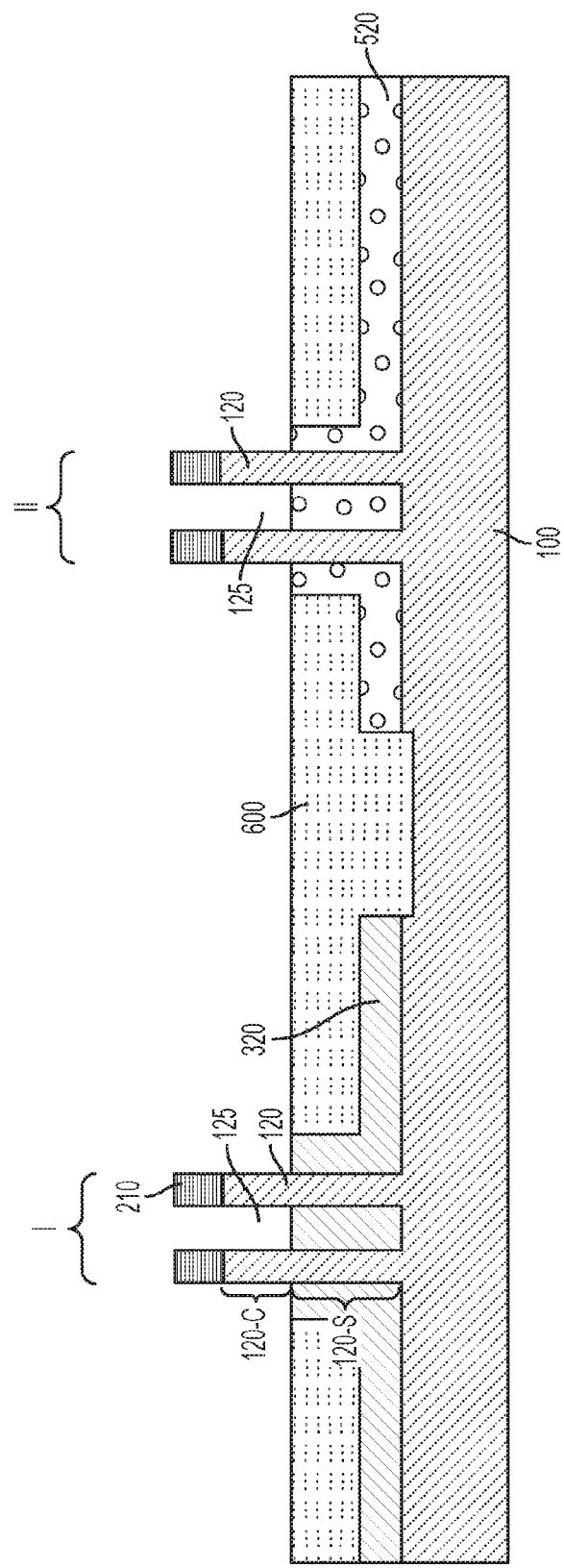
FIG. 10 shows a structure following a recess etch of the dielectric capping layer and the first and second dopant source layers to expose top portions of the semiconductor fins.

FIG. 10 shows a structure following a recess etch of the dielectric capping layer 600 and the first and second dopant source layers 320, 520 to expose top (channel) portions 120-C of the semiconductor fins 120, which defines the channel length of each device. In various embodiments, the recess etch may comprise a dry (e.g., RIE) etching process, a wet etching process, or a combination of dry and wet etching processes. Sub-fin portions 120-S of the fins 120 remain in direct contact with the dopant source layers, and the intra fin regions 125 may consist essentially of, or consist of, the respective dopant source layers. That is, in order to affect doping of the sub-fin regions within respective first and second device regions, a conformal masking layer such as the patterning hard mask 410 need not be deposited within the intra fin regions 125.

A drive-in anneal is used to diffuse dopant species from the dopant source layers into the sub-fin portions 120-S of fins 120. Thus, a p-type dopant may be diffused into the entire sub-fin region 120-S of the fins 120 within the first device region (I), an n-type dopant may be diffused into the entire sub-fin region 120-S of the fins 120 within the second device region (II), or vice versa. The drive-in anneal, which may be performed at a temperature in the range of 700-1100° C., can introduce into a fin sub-region a dopant concentration of greater than $1 \times 10^{18}$ atoms/cm$^3$.

Figure 11:
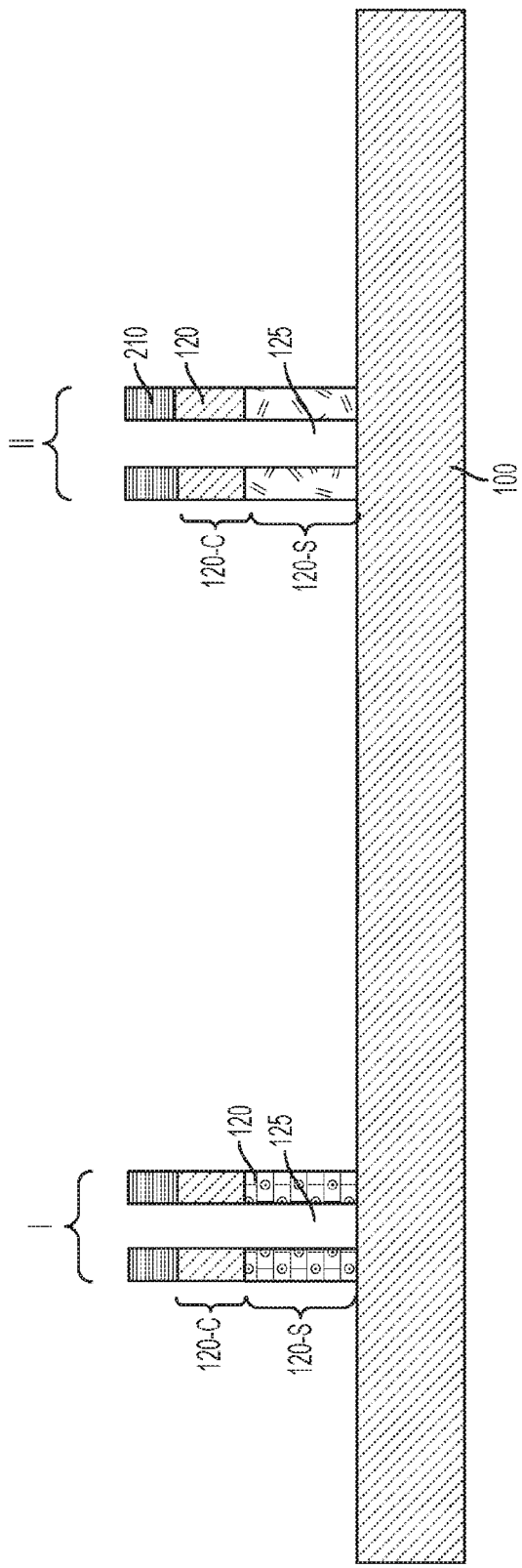
FIG. 11 depicts the fin architecture following a drive-in anneal of dopants from the dopant source layers and the subsequent removal of the dopant source layers.
Figure 12:
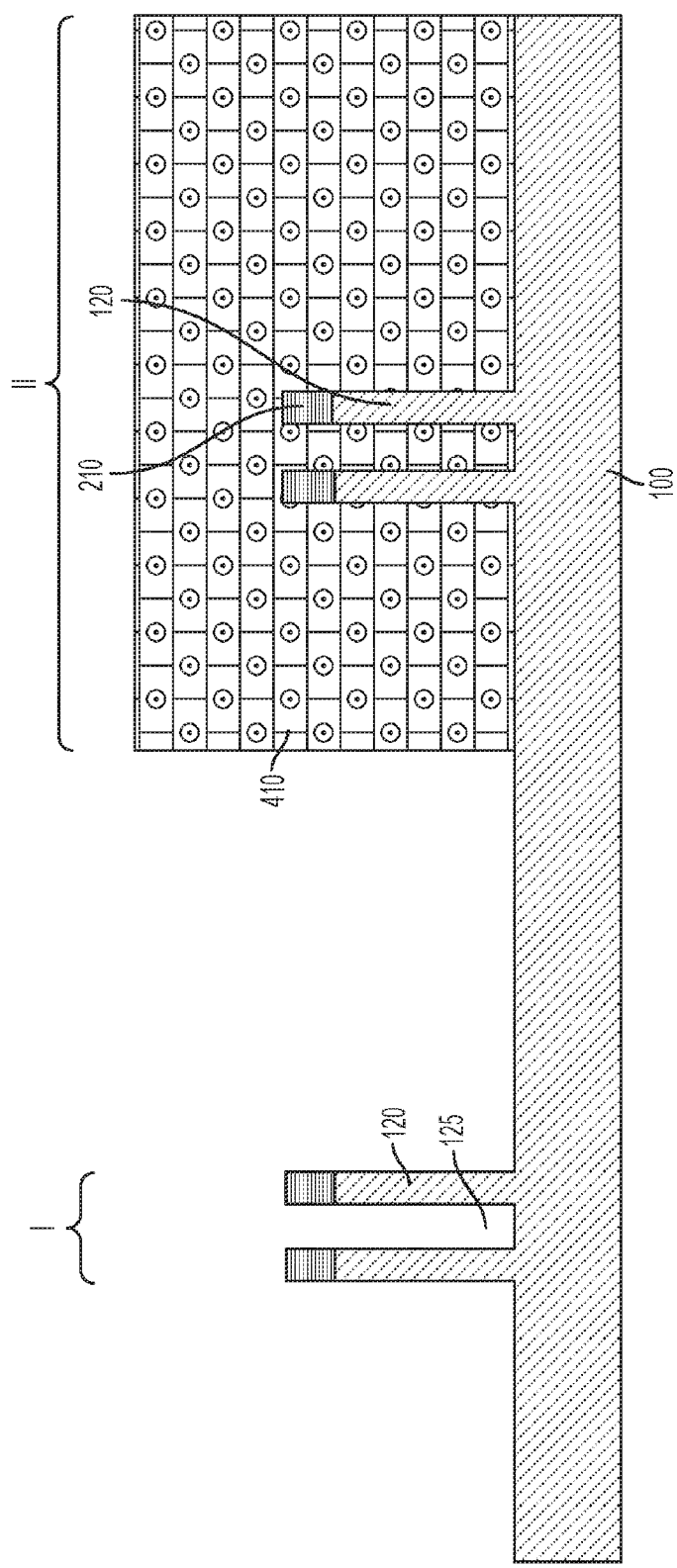
FIG. 12 is a cross-sectional diagram of an intermediate FinFET device structure according to a further, tone inversion embodiment, including the formation of a hard mask over a plurality of semiconductor fins within a second device region of a semiconductor substrate.

Referring to FIG. 11, following the drive-in anneal, the dopant source layers can then be removed using an oxide etch that is selective to silicon, i.e., selective to the fins. Additional processing may be used to form functional FinFETs, including the creation of a shallow trench isolation (STI) layer, formation of source/drain junctions, deposition of gate dielectric and gate conductor layers, and deposition of suitable contact metallization and interlayer dielectric architectures, etc. as known to those skilled in the art.

Referring again to the embodiment of FIGS. 1-11, a first dopant source layer 320 is used to dope a first fin array 120-I within a first device region of a semiconductor substrate, and a second dopant source layer 520 is used to dope a second fin array 120-II within a second device region of the substrate. Specifically, the dopant source layers are used to dope sub-fin regions of the fins with the arrays. A series of masking and etching steps are used to remove a blanket deposited first dopant source layer 320 from over the second array of fins prior to depositing the second dopant source layer 520, which is in turn patterned and etched to remove the second dopant source layer 520 from over the first array of fins. Following the formation of a dielectric capping layer 600 over the first and second device regions, and a recess etch of the dielectric capping layer 600, first dopant source layer 320, and second dopant source layer 520 to define channel regions and sub-fin regions of the fins, an annealing step diffuses dopant atoms from the dopant source layers 320, 520 in to respective sub-fin regions 120-S to the exclusion of the channel regions 120-C.

In the series of masking steps, the hard mask layers 410 are formed over the fins and laterally adjacent to the fin arrays, but not within the intra fin gaps 125 such that each of the first and second dopant source layers 320, 520 completely fill the intra fin gaps 125. This construction eliminates the need to accommodate the total conformal thickness of both a dopant source layer and one or more hard mask layers 410 within the intra fin regions 125, which is particularly beneficial as the intra fin spacing decreases below 20 nm. A dielectric layer, such as a silicon dioxide interlayer dielectric, can be formed to completely fill intra-fin gaps between the sub-fin regions of adjacent fins. Such a dielectric layer can be formed without a nitride liner.

An alternate embodiment for doping sub-fin regions for a complementary FinFET architecture is described next with reference to FIGS. 12-16. In contrast to the first embodiment (FIGS. 1-11), which involves the deposition of the first dopant source 320 layer directly over the fin arrays in each of the first and second device regions, referring to FIG. 12, a hard mask layer 412 is initially deposited and patterned to overlie the second device region (II). In turn, FIG. 13 shows the conformal deposition of a first dopant source layer 320 directly over the plurality of fins 120 within the first device region (I), and over the hard mask 412 within the second device region (II).

Figure 13:
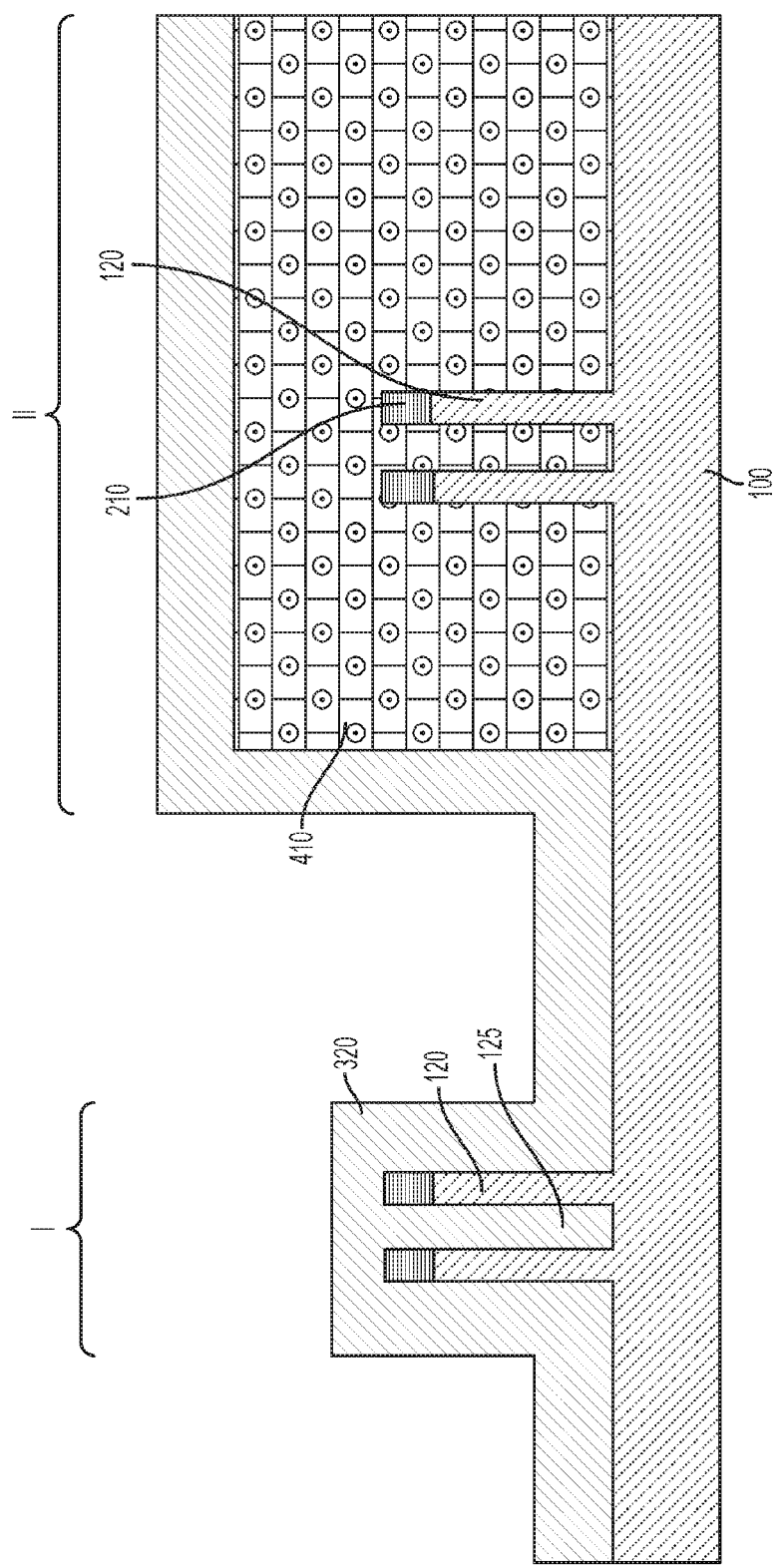
FIG. 13 shows the conformal deposition of a first dopant source layer directly over the plurality of fins within the first device region and over the hard mask within the second device region.

As seen in FIG. 13, only a single layer of material is deposited into the intra fin regions 125 within each device region. For instance, within the first device region (I), the first dopant source layer 320 completely fills the intra fin gap 125, while within the second device region (II), the hard mask layer 412 completely fills the intra fin gap 125.

Figure 14:
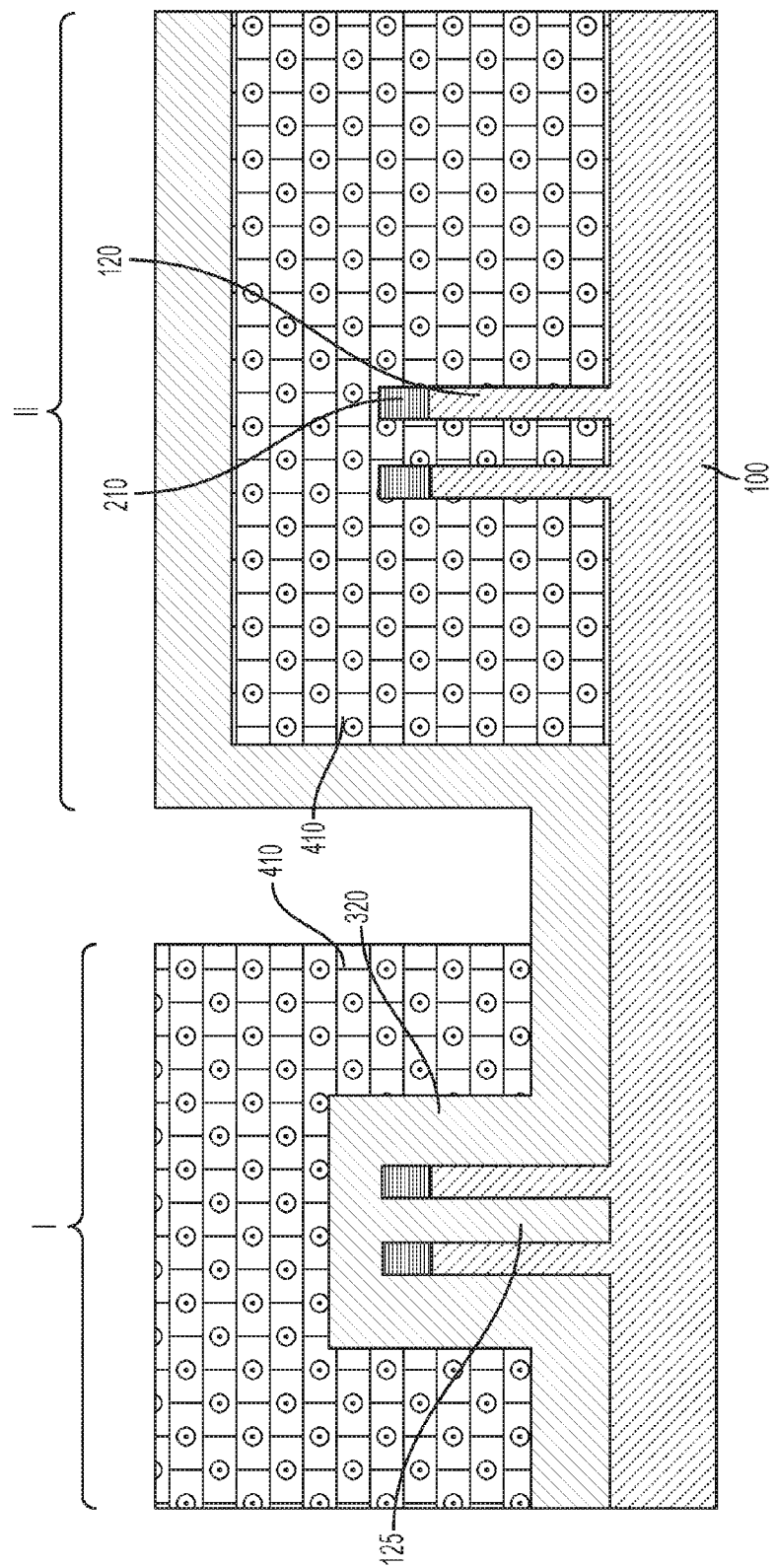
FIG. 14 shows patterning of an additional hard mask over the first dopant source layer within the first device region.
Figure 15:
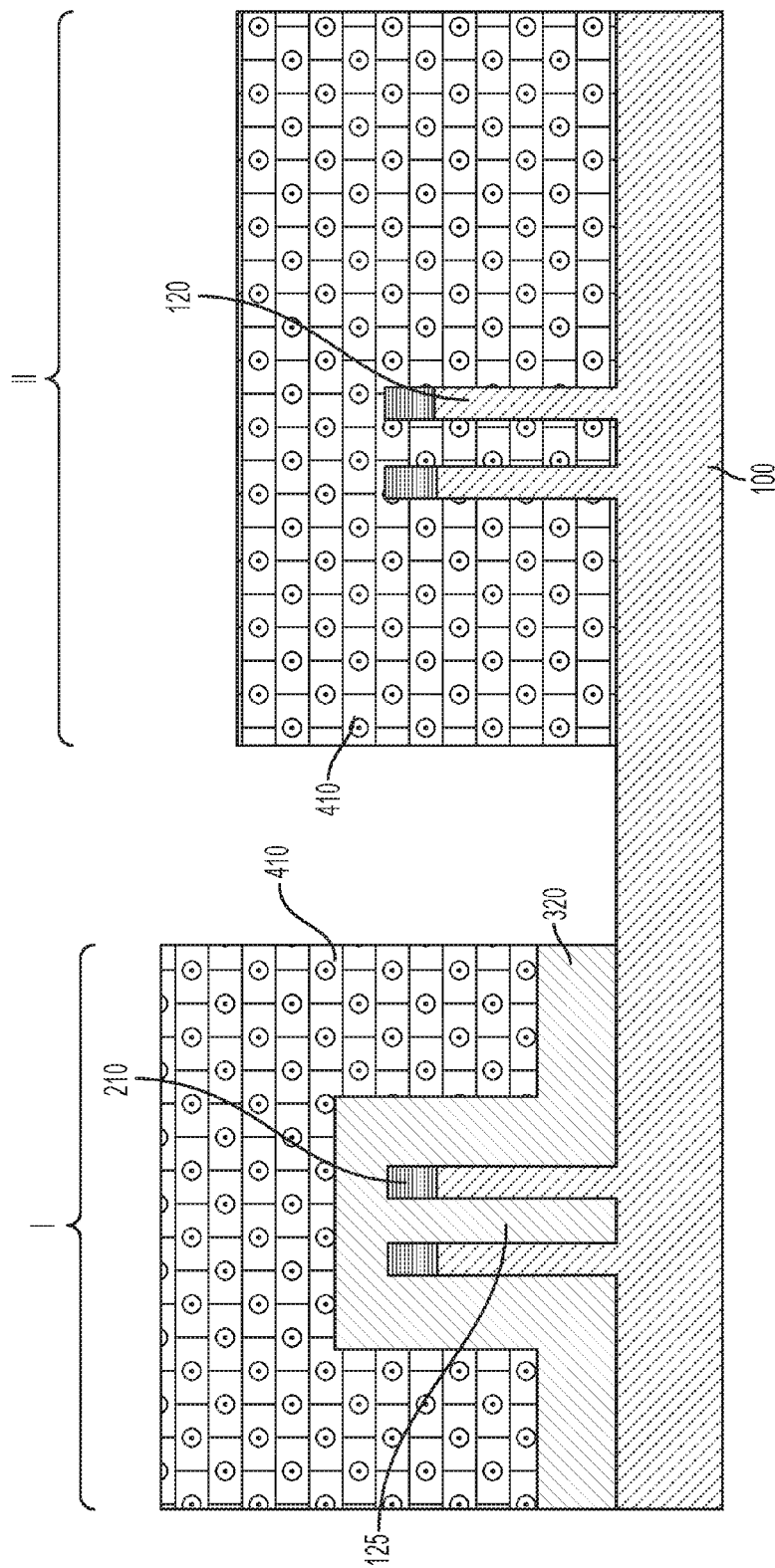
FIG. 15 shows removal of the first dopant source layer from the second device region using the additional hard mask as a block mask.

Referring to FIG. 14, an additional hard mask 410 is formed over the first dopant source layer 320 within the first device region (I). Using the additional hard mask 410 as an etch mask, the first dopant source layer 320 is removed from the second device region (II), as illustrated in FIG. 15.

Figure 16:
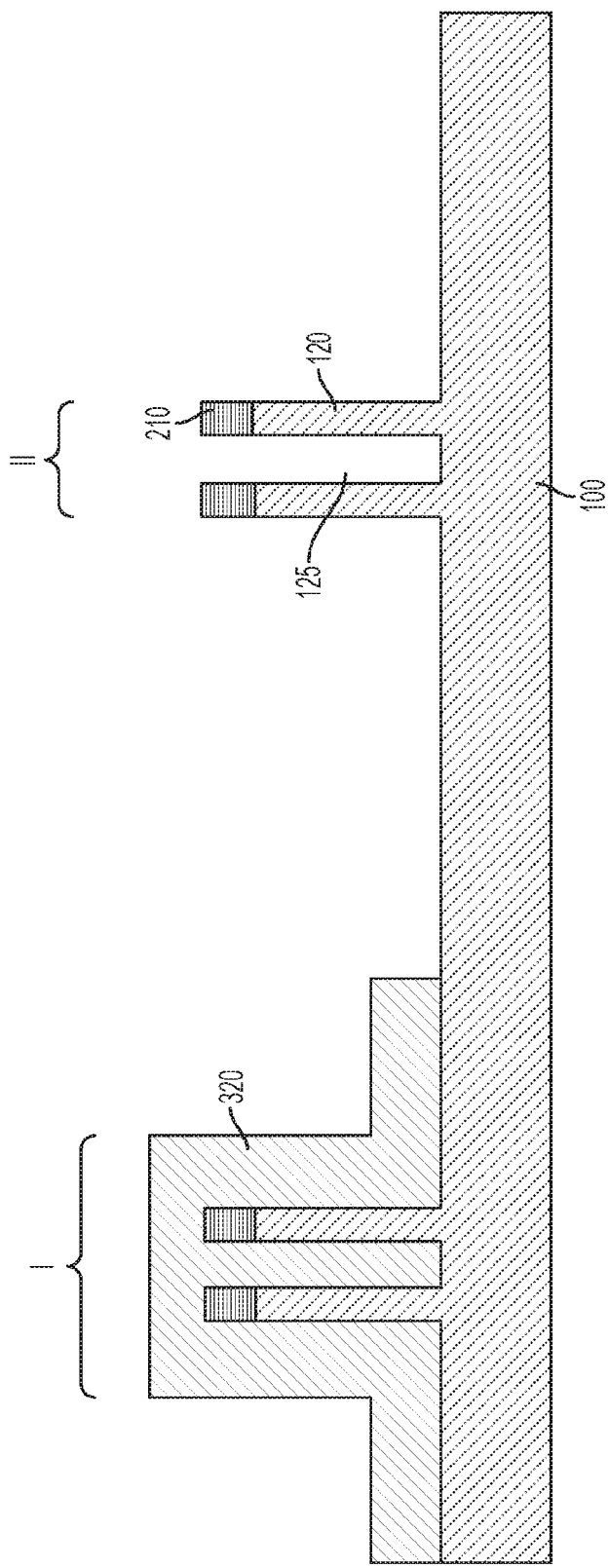
FIG. 16 shows stripping of the hard mask layers from over the patterned first dopant source layer within the first device region and from over the fins and exposure substrate within the second device region.

After stripping the hard mask layers 410, 412, the resulting structure includes first dopant source layer 320 disposed over and amongst the first array of fins within the first device region (I), is illustrated in FIG. 16. The structure of FIG. 16 is analogous to the structure of FIG. 3. Thus, the process of the second embodiment may continue as in the manner of the first embodiment with reference to FIGS. 4-11, i.e., deposition and patterning of the second dopant source layer 520 over the second fin array 120-II within the second device region (II), followed by the deposition and planarization of the dielectric capping layer 600, the recess etch to define channel regions and sub-fin regions, and a drive-in anneal to dope the sub-fin regions.

As used herein, the singular forms "a," "an" and "the" include plural referents unless the context clearly dictates otherwise. Thus, for example, reference to a "fm" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a semiconductor fin that comprises silicon include embodiments where a semiconductor fin consists essentially of silicon and embodiments where a semiconductor fin consists of silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of fabricating a semiconductor structure, comprising:

forming a plurality of semiconductor fins over a semiconductor substrate, the semiconductor fins including a first fin array over a first device region of the substrate and a second fin array over a second device region of the substrate;

forming a first dopant source layer over the first fin array, wherein the first dopant source layer entirely fills intra fin gaps within the first fin array;

forming a second dopant source layer over the second fin array, wherein the second dopant source layer entirely fills intra fin gaps within the second fin array, wherein forming the first dopant source layer over the first fin array further comprises forming the first dopant source layer over the second fin array, the first dopant source layer entirely filling the intra fin gaps within the second fin array; and selectively removing the first dopant source layer from over the second fin array prior to forming the second dopant source layer over the second fin array.

2. The method of claim 1, wherein the first dopant source layer is formed directly over sidewalls of the fins within the first fin array, and the second dopant source layer is formed directly over sidewalls of the fins within the second fin array.

3. The method of claim 1, wherein the fins within the first fin array are arranged at a pitch of 20 to 100 nm, and the fins within the second fin array are independently arranged at a pitch of 20 to 100 nm.

4. The method of claim 1, further comprising recessing the first and second dopant source layers to expose a channel region of the fins in each of the first and second device regions.

5. The method of claim 4, further comprising driving dopants from the dopant source layers into sub-fin regions of the fins below the channel regions.

6. The method of claim 5, further comprising removing the dopant source layers.

7. The method of claim 1, wherein the first dopant source layer comprises borosilicate glass and the second dopant source layer comprises phosphosilicate glass.

8. The method of claim 1, further comprising forming a block mask over the second fin array prior to forming the first dopant source layer over the first fin array.

9. A method of fabricating a semiconductor structure, comprising:

forming a first fin array over a first device region of a semiconductor substrate;

forming a second fin array over a second device region of the substrate;

forming a first dopant source layer directly over the first fin array, wherein the first dopant source layer entirely fills intra fin gaps within the first fin array;

forming a second dopant source layer directly over the second fin array, wherein the second dopant source layer entirely fills intra fin gaps within the second fin array;

driving dopants from the dopant source layers into sub-fin regions of the fins below channel regions of the fins, wherein forming the first dopant source layer over the first fin array further comprises forming the first dopant source layer over the second fin array, the first dopant source layer at least partially filling the intra fin gaps within the second fin array; and selectively removing the first dopant source layer from over the second fin array prior to forming the second dopant source layer over the second fin array.

10. The method of claim 9, further comprising recessing the first and second dopant source layers to expose the channel regions prior to driving the dopants.

11. The method of claim 9, wherein the first dopant source layer is formed directly over sidewalls of the fins within the first fin array, and the second dopant source layer is formed directly over sidewalls of the fins within the second fin array.

12. The method of claim 9, wherein the fins within the first fin array are arranged at a pitch of 20 to 100 nm, and the fins within the second fin array are independently arranged at a pitch of 20 to 100 nm.

13. The method of claim 9, further comprising removing the dopant source layers.

14. The method of claim 9, wherein the first dopant source layer comprises borosilicate glass and the second dopant source layer comprises phosphosilicate glass.

15. The method of claim 9, further comprising forming a block mask over the second fin array prior to forming the first dopant source layer over the first fin array.

16. A method of fabricating a semiconductor structure, comprising:

forming a plurality of semiconductor fins over a semiconductor substrate, the semiconductor fins including a first fin array over a first device region of the substrate and a second fin array over a second device region of the substrate, wherein the fins within the first fin array are arranged at a pitch of 20 to 100 nm, and the fins within the second fin array are independently arranged at a pitch of 20 to 100 nm;

forming a first dopant source layer over the first fin array, wherein the first dopant source layer entirely fills intra fin gaps within the first fin array; and forming a second dopant source layer over the second fin array, wherein the second dopant source layer entirely fills intra fin gaps within the second fin array.

* * * * *